(12) United States Patent
Moon

(10) Patent No.: US 7,774,738 B2
(45) Date of Patent: Aug. 10, 2010

(54) LITHOGRAPHY METHOD FOR FORMING A CIRCUIT PATTERN

(75) Inventor: Jae In Moon, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 453 days.

(21) Appl. No.: 11/897,600

(22) Filed: Aug. 31, 2007

(65) Prior Publication Data
US 2008/0235652 A1    Sep. 25, 2008

(30) Foreign Application Priority Data
Mar. 23, 2007    (KR) .................. 10-2007-0028623

(51) Int. Cl.
*G06F 17/50*    (2006.01)
(52) U.S. Cl. .......................................... 716/19; 716/21
(58) Field of Classification Search ............ 716/19–21; 430/5, 22, 30
See application file for complete search history.

(56) References Cited

U.S. PATENT DOCUMENTS

2002/0091985 A1    7/2002    Liebmann et al.
2005/0130047 A1    6/2005    Kroyan
2005/0268256 A1    12/2005   Tsai et al.
2006/0129968 A1*   6/2006    Pierrat ........................ 716/21

FOREIGN PATENT DOCUMENTS

| JP | 2004-087715 | 3/2004 |
| JP | 2004-134594 | 4/2004 |
| KR | 10-1997-0023829 | 5/1997 |
| KR | 10-2000-0014091 | 3/2000 |

* cited by examiner

*Primary Examiner*—Paul Dinh
(74) *Attorney, Agent, or Firm*—Marshall, Gerstein & Borun LLP

(57) ABSTRACT

A lithography method for suppressing resist scum includes the steps of designing an original layout with line patterns and pad patterns, extracting a pad pattern layout from the original, layout, obtaining a first reduction layout which is reduced by a first reduction width relative to the pad pattern layout, obtaining a second reduction layout which is reduced by a second reduction width larger than the first reduction width relative to the pad pattern layout, obtaining an assist pattern layout which is self-aligned to the pad pattern layout by deducting the second reduction layout from the first reduction layout, generating assist patterns in the original layout by deducting the assist pattern layout from the original layout, and projecting the layout including the assist patterns on a semiconductor substrate by an exposure process.

22 Claims, 17 Drawing Sheets
(2 of 17 Drawing Sheet(s) Filed in Color)

LITHOGRAPHY METHOD FOR FORMING A CIRCUIT PATTERN

CROSS-REFERENCE TO RELATED APPLICATION

The priority of Korean application number 10-2007-0028623, filed on 23 Mar. 2007, the entire disclosure of which is incorporated by reference in its entirety, is claimed.

BACKGROUND OF THE INVENTION

1. Field of Invention

The present invention relates to a method for fabricating semiconductor devices and, more particularly, to a lithography method for suppressing scum in an exposure process.

2. Related Technology

As integrated circuit devices such as semiconductor devices become more highly integrated, many studies on improving electrical characteristics of the device or securing process margins have been carried out. In the case of semiconductor memory devices such as a NAND flash memory or a DRAM memory, memory capacities have become larger and critical dimensions (CD) of patterns constituting the device have rapidly decreased in size. It has become more important to transfer circuit pattern layouts designed for the devices on wafers in lithography processes.

As pattern sizes of semiconductor devices become smaller and semiconductor devices having new structures are developed, resolution enhancement technologies are frequently used in exposure processes. For one of the resolution enhancement technologies, asymmetric illumination systems, such as dipole illumination systems, have been introduced in exposure processes. In cases of introducing dipole illumination systems, there is merit in forming circuits having relatively minute lines and spaces. Scum, which is undesired photoresist residue, may be formed around larger patterns or pad patterns that are designed to have a relatively large size and space as compared to line patterns.

FIGS. 1 to 3 illustrate scum formed in an exposure process. Referring to FIG. 1, a dipole illumination system 10 to improve the resolution of a line pattern and a space pattern can be introduced by using an aperture structure having openings 11 in an x-direction of an x-y coordinate system, as illustrated. As positions of the openings 11 are closer to edges and farther from the center of the aperture structure, a more extremely modified dipole illumination system can be implemented. In the case of using the extreme dipole illumination system illustrated in FIG. 1 with a high number of aperture (NA) lens system of 0.90 NA, an image of a line and space pattern having a more minute line width can be implemented on a wafer.

When implementing a pattern having a more minute line width by using such an extreme illumination system, scum can be formed around larger patterns. As shown in FIG. 2, an original layout 20 of a circuit pattern for a semiconductor device is designed by setting both line patterns 21 for wiring, and spaces between the line patterns, as reference patterns. A large pattern, such as a pad 23 for an interconnection wiring, having a relatively large line width as compared to a line pattern 21, is also needed to implement a circuit. A space 25 between pads 23 is also set with a relatively large interval, compared to another space 26 between line patterns 21.

Accordingly, in the case of projecting an original layout 20 of such a circuit pattern on a photoresist of a wafer by using the extreme dipole illumination system as shown in FIG. 1, a layout 30 of a photoresist pattern can be implemented as shown in FIG. 3. Along with the shape of a line pattern 31 and pads 33, scum 37 comprising undesired photoresist residue can be defectively generated in a space 35 between the pads. The region where the scum 37 is generated can be understood as a region where insufficient light energy is exposed. As interference of exposure light occurs depending on the pads 23 in FIG. 2 positioned around the region where the scum 37 is generated and the space 35 therebetween, the scum 37 results.

Since the scum 37 of the photoresist causes undesired pattern formation on a wafer, a technology of suppressing or preventing the scum 37 in order to suppress a defective pattern on a wafer is desirable. In order to prevent the scum 37, various optical proximity correction technologies or resolution improvement technologies may be tried.

SUMMARY OF THE INVENTION

The invention provides a lithography method capable of suppressing a scum in an exposure process by forming assist patterns to be self-aligned in an original layout of a circuit pattern.

In an embodiment of the invention, a lithography method for forming a circuit pattern on a semiconductor substrate comprises the steps of: designing an original layout including a line pattern and a pad pattern; extracting the pad pattern layout from the original layout; obtaining a first reduction layout which is reduced by a first reduction width relative to a layout of the extracted pad pattern; obtaining a second reduction layout which is reduced by a second reduction width larger than the first reduction width relative to the layout of the pad pattern; obtaining a layout of an assist pattern which is self-aligned for the layout of the pad pattern by deducting the second reduction layout from the first reduction layout; generating an assist pattern in the original layout by deducting the layout of the assist pattern from the original layout; and projecting a layout having the assist pattern on a semiconductor substrate by an exposure process. The pad patterns preferably have line widths and spaces relatively larger than those of the line patterns. The first reduction layout is preferably reduced by the first reduction width in equal amounts in both an x-direction and a y-direction, or is reduced by the first reduction width in different amounts in the x-direction and the y-direction. The second reduction width is preferably larger than the first reduction width in one of an x-direction and a y-direction and is equal to the first reduction width in the other direction, thereby resulting in an assist pattern in the form of a scattering bar. Alternatively, the second reduction width is larger than the first reduction width in both an x-direction and a y-direction, thereby resulting in an assist pattern in the form of a scattering ring. The steps of obtaining the layout of the assist pattern preferably includes the steps of performing a Boolean operation in which pattern information is included in data of the first reduction layout but not in data of the second reduction layout. The steps of generating the assist pattern in the original layout preferably includes the steps of performing a Boolean operation in which pattern information is included in data of the original layout but not in data of the layout of the assist pattern. The lithography method preferably further comprises the steps of extracting an error pattern smaller than a reference size and removing the error pattern when generating the assist pattern in the original layout. Also, the lithography method preferably further comprises the steps of performing an optical proximity correction on the layout in which the assist pattern is generated. The exposure process is preferably performed by an asymmetrically modified illumination system.

In another embodiment of the invention a lithography method for forming a circuit pattern on a semiconductor substrate includes the steps of: designing an original layout including a line pattern and a pad pattern; extracting the pad pattern layout from the original layout; obtaining a first reduction layout which is reduced by a first reduction width relative to a layout of the extracted pad pattern; obtaining a second reduction layout which is reduced by a second reduction width relative to the layout of the first reduction layout; obtaining a layout of an assist pattern which is self-aligned for the layout of the pad pattern by deducting the second reduction layout from the first reduction layout; generating an assist pattern in the original layout by deducting the layout of the assist pattern from the original layout; and projecting a layout having the assist pattern on a semiconductor substrate by an exposure process.

In still another embodiment of the invention, a method of forming a circuit pattern on a semiconductor substrate includes the steps of: designing an original layout including a line pattern and a pad pattern; setting up an asymmetrically modified illumination system to be used in an exposure process by which the layout may be projected on a semiconductor substrate; extracting the pad pattern layout from the original layout; obtaining a first reduction layout which is reduced by a first reduction width relative to a layout of the extracted pad pattern; obtaining a second reduction layout which is reduced by a second reduction width larger than the first reduction width in one direction depending on an asymmetric direction of the modified illumination system for the layout of the pad pattern; obtaining a layout of an assist pattern in a form of a scattering bar, which is self-aligned for the layout of the pad pattern by deducting the second reduction layout from the first reduction layout; generating an assist pattern in the original layout by deducting the layout of the assist pattern from the original layout; and projecting a layout having the assist pattern on a semiconductor substrate by an exposure process. The asymmetrically modified illumination system preferably includes a dipole illumination system in an x-direction having an aperture structure in which openings are positioned in the x-direction of an x-y coordinate system and the second reduction width is set in the x-direction so that the assist pattern is extended in form of a bar in the y-direction.

In yet another embodiment, the invention provides a lithography method for forming a circuit pattern on a semiconductor substrate including the steps of: designing an original layout including a line pattern and a pad pattern; setting up an asymmetrically modified illumination system to be used in an exposure process by which the layout can be projected on a semiconductor substrate; extracting the pad pattern from the original layout; obtaining a first reduction layout which is reduced by a first reduction width relative to a layout of the extracted pad pattern; obtaining a second reduction layout which is reduced by a second reduction width in one direction depending on an asymmetric direction of the modified illumination system relative to the layout of the first reduction layout; obtaining a layout of an assist pattern in a form of a scattering bar, which is self-aligned to the layout of the pad pattern by deducting the second reduction layout from the first reduction layout; generating an assist pattern in the original layout by deducting the layout of the assist pattern from the original layout; and projecting a layout having the assist pattern on a semiconductor substrate by an exposure process.

BRIEF DESCRIPTION OF THE DRAWINGS

The application file contains two drawings executed in color (FIGS. 14 and 15). Copies of this patent application publication with color drawings will be provided by the Office upon request and payment of the necessary fee.

DETAILED DESCRIPTION OF THE PREFERRED EMBODIMENTS

Embodiments of the invention provide a method of generating and inserting assist patterns (or assist features) which can be self-assembled in an original layout by using the original layout of a circuit pattern of a semiconductor device. Assist patterns are introduced in order to suppress photoresist scum which is caused by light interference at the time of exposure. Since the assist patterns are aligned and generated based on an original layout, they can be automatically generated through a data processing technique on a computer based on the original layout. At this time, as the assist patterns are generated based on the shape of a circuit pattern layout itself, the assist patterns can be automatically generated for a complex circuit layout including circuit patterns of various shapes.

Figure 4:
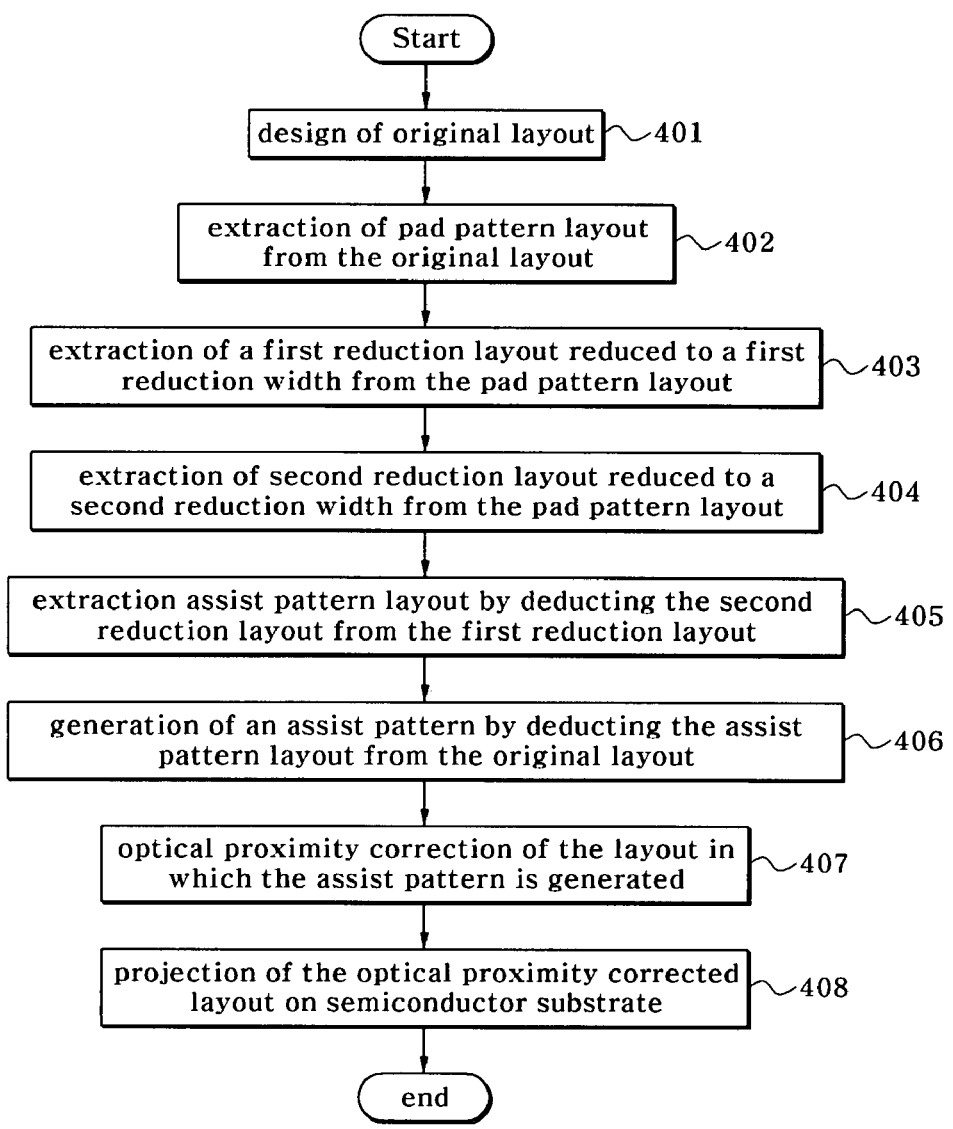
FIG. 4 is a schematic flow chart illustrating a lithography method of suppressing scum in an exposure process of forming a circuit pattern on a semiconductor substrate.
Figure 5:
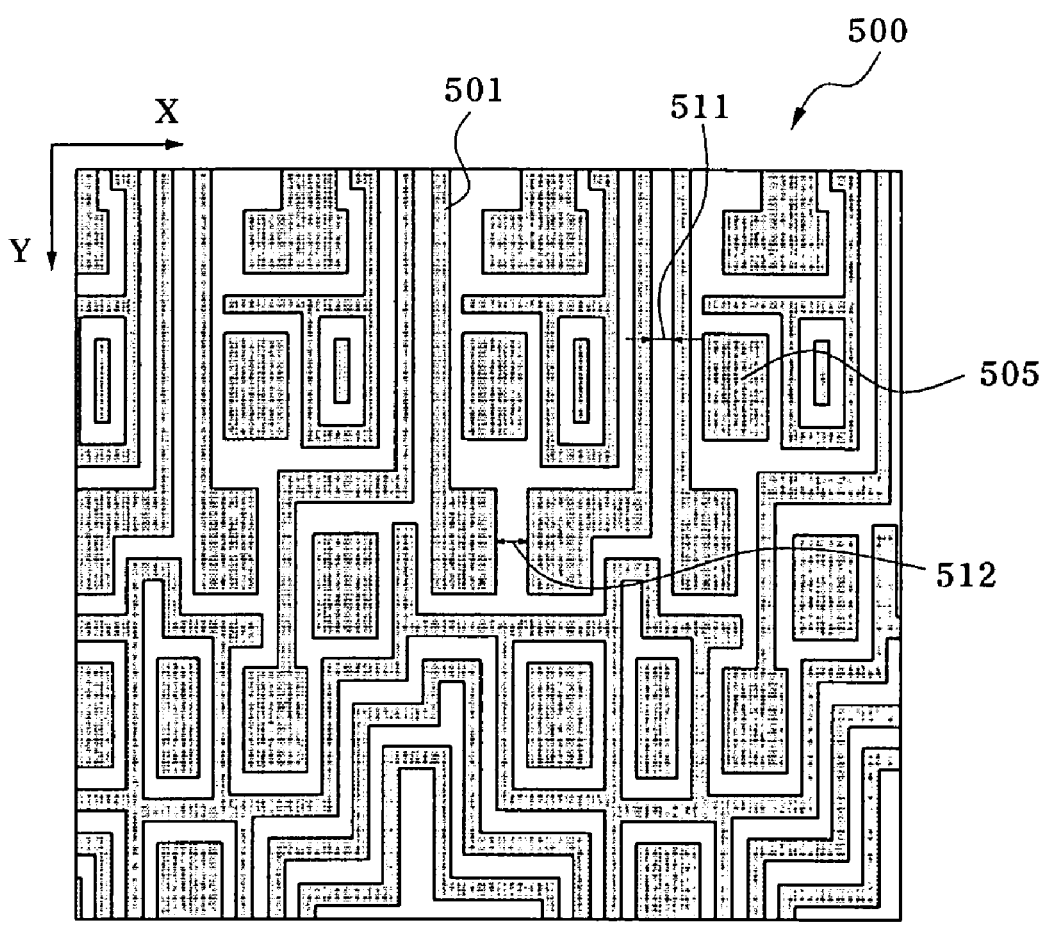
FIGS. 5 to 12 are schematic layouts illustrating a lithography method of suppressing scum in an exposure process of forming a circuit pattern on a semiconductor substrate.

Referring to FIGS. 4 and 5, an original layout 500 in FIG. 5 of a circuit pattern to be projected on a semiconductor substrate or a wafer and embodied is designed at step 401 (FIG. 4). The original layout 500 can include line patterns 501 for wiring and a pattern layout including pad patterns 505 coupled to the line patterns 501.

At this time, the line patterns 501 and spaces between the line patterns 501 can be designed based on a design rule for designing the original layout 500 of a circuit. Also, the pad patterns 505 can be larger than the line patterns 501. A first space 511 between the line patterns 501 can be smaller than a second space 512 between the pad patterns 505. The line patterns 501 can be a layout of a pattern for a wire, and the pad patterns 505 can be a connecting pad for an electrical interconnection, for example. The pad patterns 505 can be an electrode of a capacitor or a pattern for another wire which is larger than the line patterns 501, for example.

Figure 1:
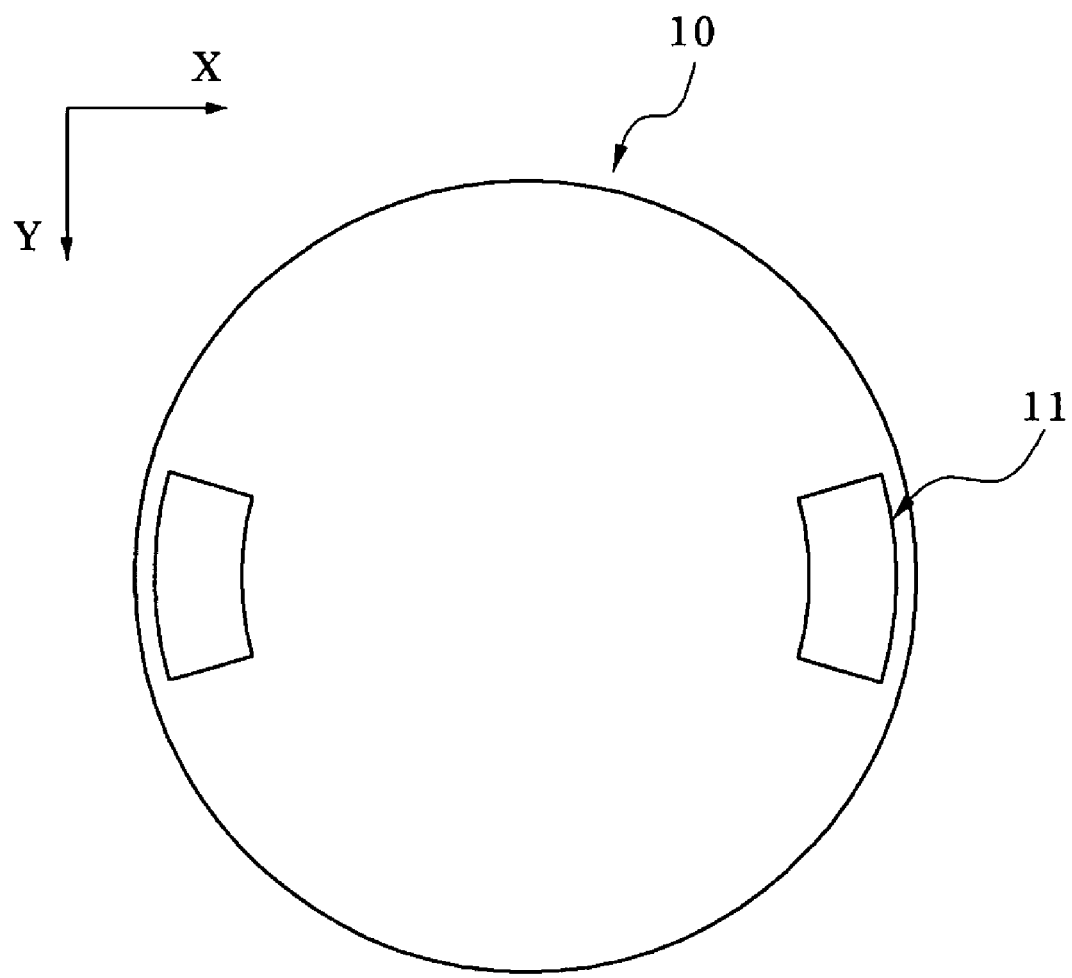
FIGS. 1 to 3 illustrate scum caused in an exposure process.
Figure 2:
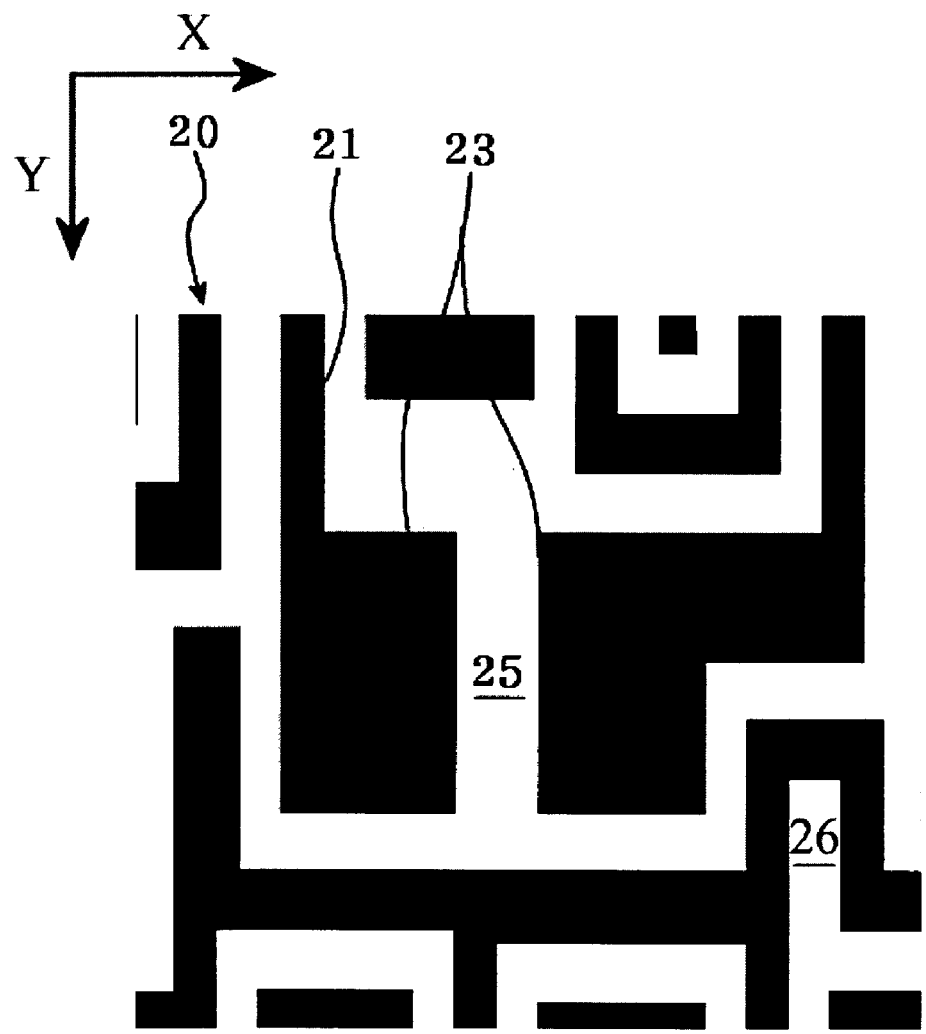
Figure 3:
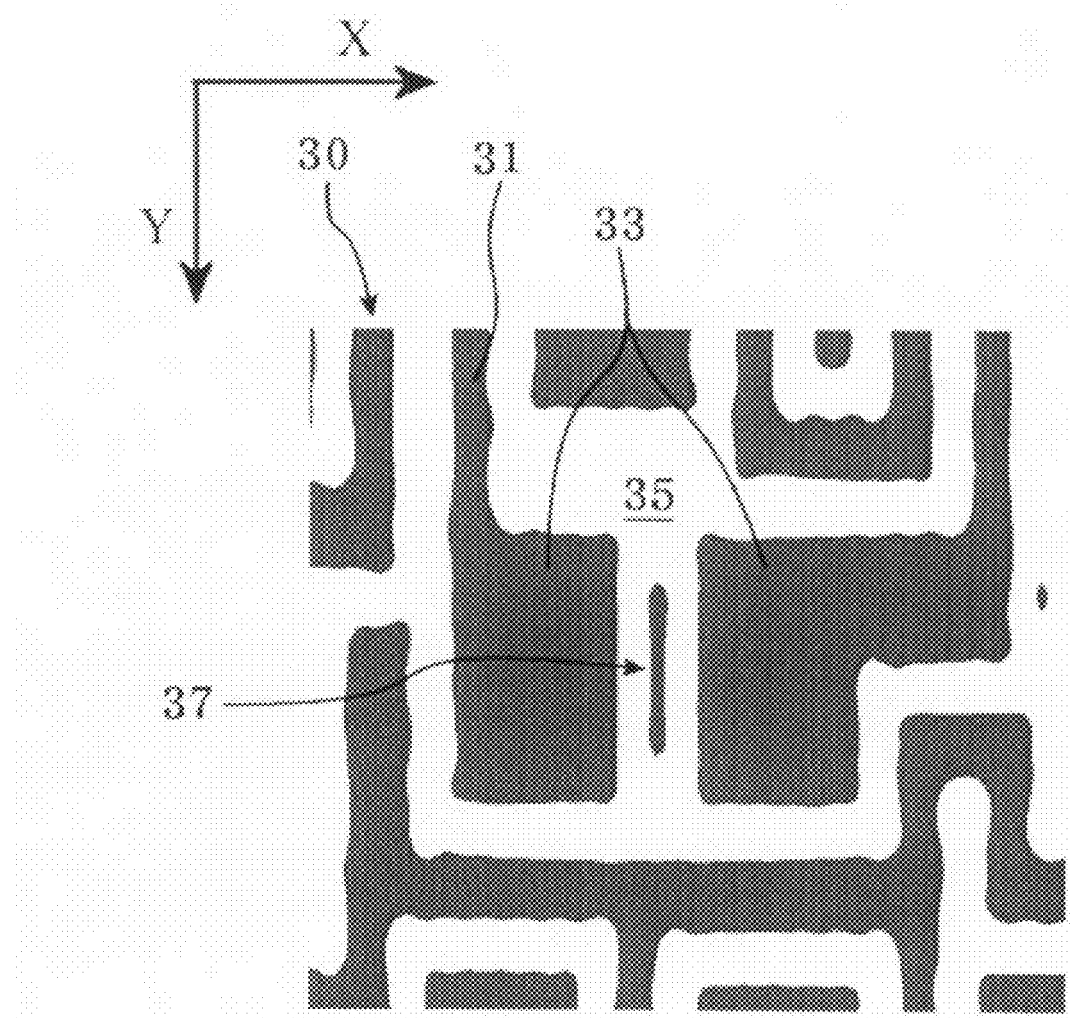

The original layout 500 can be designed in consideration of an exposure process to be used when implemented on a photomask and projected on the wafer. For example, in the case of introducing a dipole illumination system in an exposure process as suggested in FIG. 1, a direction of extending the line patterns 501 can be set considering a direction of an asymmetrically modified illumination system. For example, in the case that the opening 11 is positioned in an x-direction as shown in FIG. 1, the line patterns 501 can be aligned to be extended in a y-direction.

Figure 6:
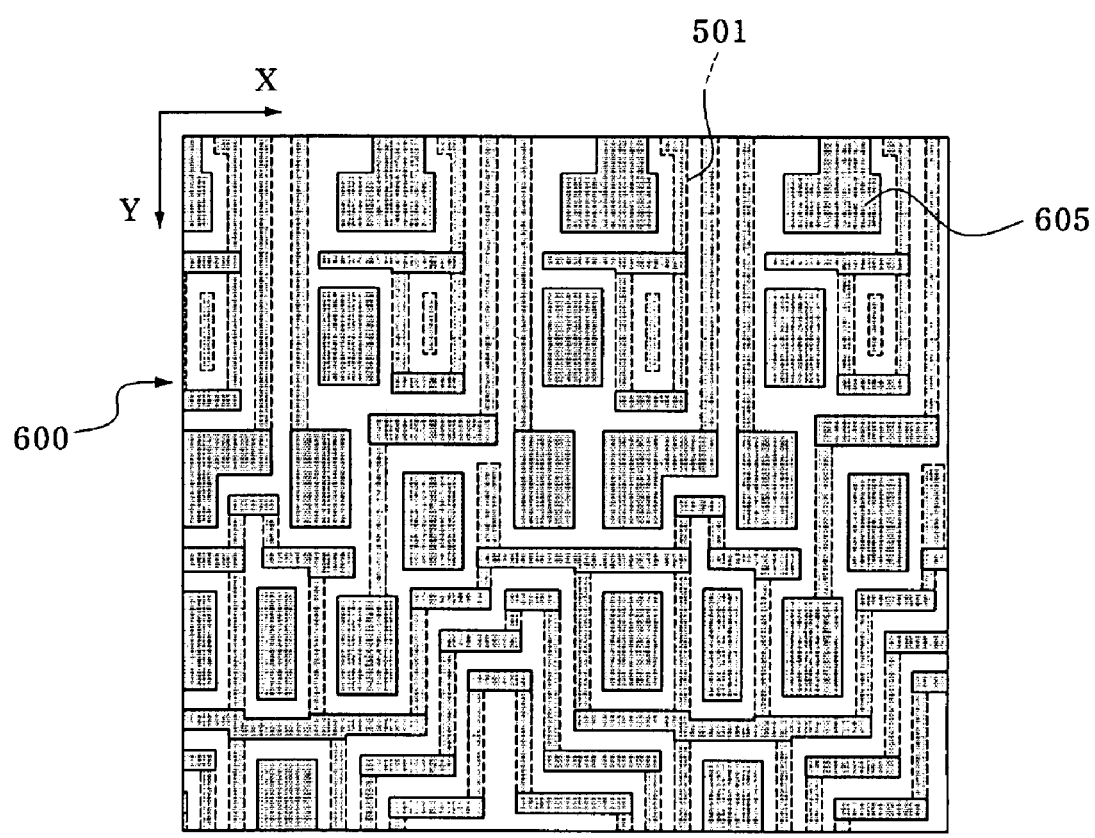

Referring to FIG. 6, a layout 600 of a pad pattern 605 is extracted from the original layout 500 in FIG. 5 at step 402 of FIG. 4. In FIG. 6, the pad patterns 605 correspond to the pad patterns 505 from FIG. 5, and are represented by regions enclosed by solid lines. The regions in FIG. 6 bounded by dashed lines correspond to the areas of the line patterns 501 in FIG. 5, but are not part of the layout 600. Such data extraction can be achieved by a data processing technique which utilizes a circuit design apparatus and a computer.

Figure 7:
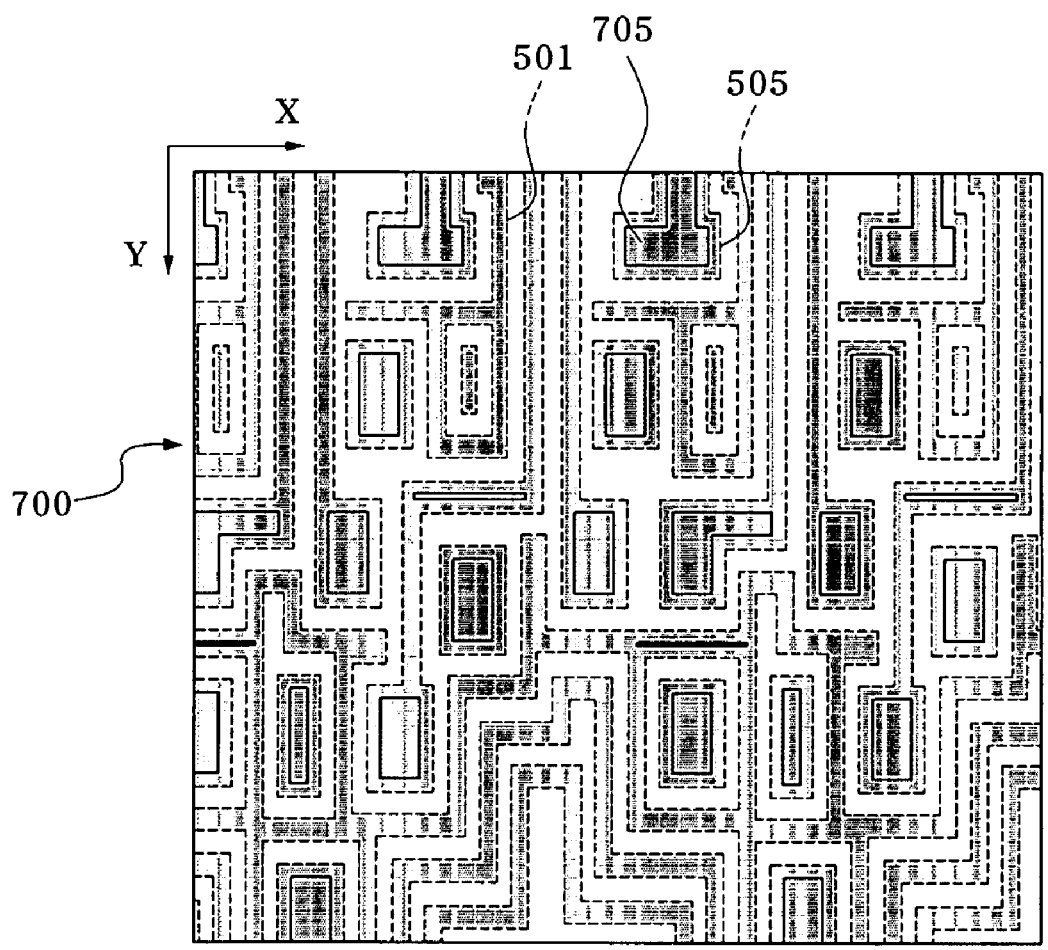

Referring to FIG. 7, a first reduction layout 700 which is reduced by a first reduction width relative to the layout 600 in FIG. 6 of the extracted pad pattern 605 in FIG. 6 is obtained at step 403 of FIG. 4. At this time, the first reduction width can be set as a constant numerical value in the x-direction and the y-direction, for example. The first reduction width can be set considering a scattering of assist patterns to be generated. The first reduction width can be set differently in both the x-direction and the y-direction, but it can also be set as the same numerical value, from several nanometers to several tens of nanometers, for example about 3 nm to about 90 nm. Accordingly, the first reduction layout 700 includes patterns 705 of a reduced shape which follows a shape of the pad pattern 605 in FIG. 6.

Figure 8:
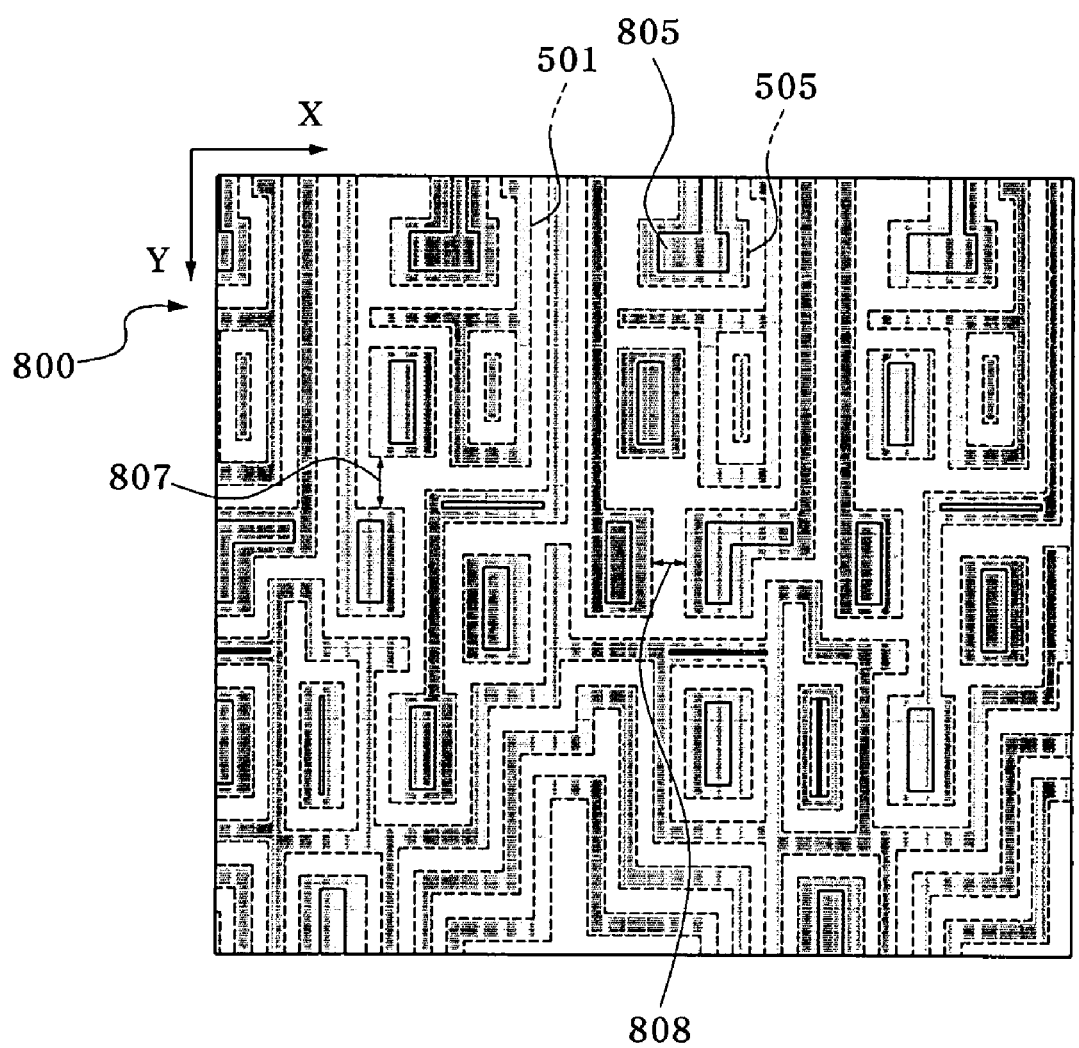

Referring to FIG. 8, a second reduction layout 800 which is reduced by a second reduction width relative to the layout 600 in FIG. 6 of the extracted pad pattern is obtained at step 404 of FIG. 4. At this time, the second reduction width can be set to have a reduction width larger than the first reduction width, for example. For example, the second reduction width can be set as a numerical value relative to the first reduction width (i.e., the first reduction width+α). At this time, "α" can be set depending on a line width of a subsequent assist pattern. "α" can be set as several nanometers to several tens of nanometers, for example about 3 nm to about 90 nm, considering a scattering of the assist patterns.

Meanwhile, although the second reduction width can be set to be applied in the x-direction and the y-direction, it can also be set only in the x-direction and have a reduction width of "0" in the y-direction according to circumstances. The second reduction width can be set depending on a direction of illumination in an exposure process.

As shown in FIG. 1, in case of introducing an asymmetrically modified illumination system, such as a dipole illumination system, in the x-direction, a resolution in the x-direction for the line patterns 501 extended in the y-direction is strengthened. Compared to this, a resolution for a pattern in the y-direction is rather weak in practice. Thus, the probability of the scum formation for a space 807 between the pad patterns 505 in the x-direction is high and the probability of the scum occurrence for a space 808 between the pad patterns 505 in the y-direction is relatively low. Considering this, the generation of a light scattering assist pattern which causes a scattering in the y-direction is not required.

Depending on the direction of an asymmetrically modified illumination system, the generation of the assist patterns can be limited to a particular direction. That is, as shown in FIG. 1, in case of the dipole illumination in the x-direction, the second reduction width can be set selectively only in the x-direction. Nonetheless, in case of the symmetrically modified illumination such as a quadrupole illumination or a conventional illumination, the second reduction width can be set both in the x-direction and the y-direction.

Meanwhile, although the second reduction width can be set as a relative numerical value (i.e. the first reduction width+α) considering a case that it is extracted from the layout 600 of the pad patterns, the second reduction layout 800 can be directly extracted from the first reduction layout 700 as shown in FIG. 7. For example, the second reduction layout 800 can be extracted through reducing the first reduction layout 700 by setting a third reduction width "α" relative to the first reduction layout 700. In this case, the extracted second reduction layout 800 is likewise obtained as a layout reduced by the total width of the first reduction width and "α" relative to the layout 600 of the pad patterns.

Figure 9:
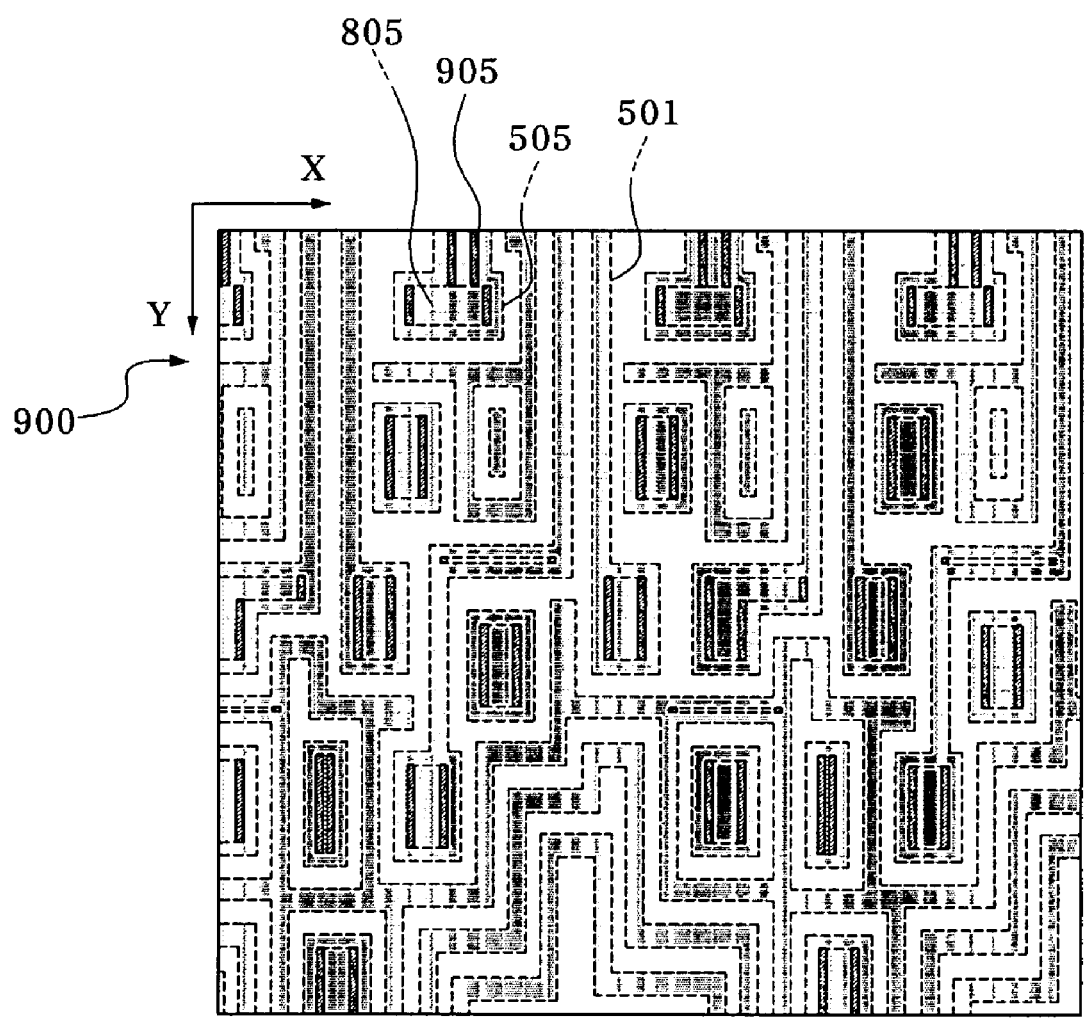

Referring to FIG. 9, an assist pattern layout 900 is extracted at step 405 of FIG. 4 by deducting the second reduction layout 800 in FIG. 8 from the first reduction layout 700 in FIG. 7. Such an extraction of the assist pattern layout 900 can be performed through a data processing technique using a Boolean operation. For example, data on the assist pattern layout 900 can be obtained by performing a Boolean operation with a condition of the first reduction layout 700 but not the second reduction layout 800.

Since FIG. 9 shows the assist pattern layout 900 according to a result of selecting the second reduction width relative to the first reduction width to be the same in the y-direction but increased in the x-direction (i.e., α=0 in the y-direction and α>0 in the x-direction), the assist patterns 905 have a layout in a form of a bar extending in the y-direction. When the second reduction width is increased relative to the first reduction width in both the x-direction and the y-direction, the assist pattern layout is generated in a form of a rectangular ring, with additional bars (not shown) extending in the x-direction to connect the assist patterns.

Figure 10:
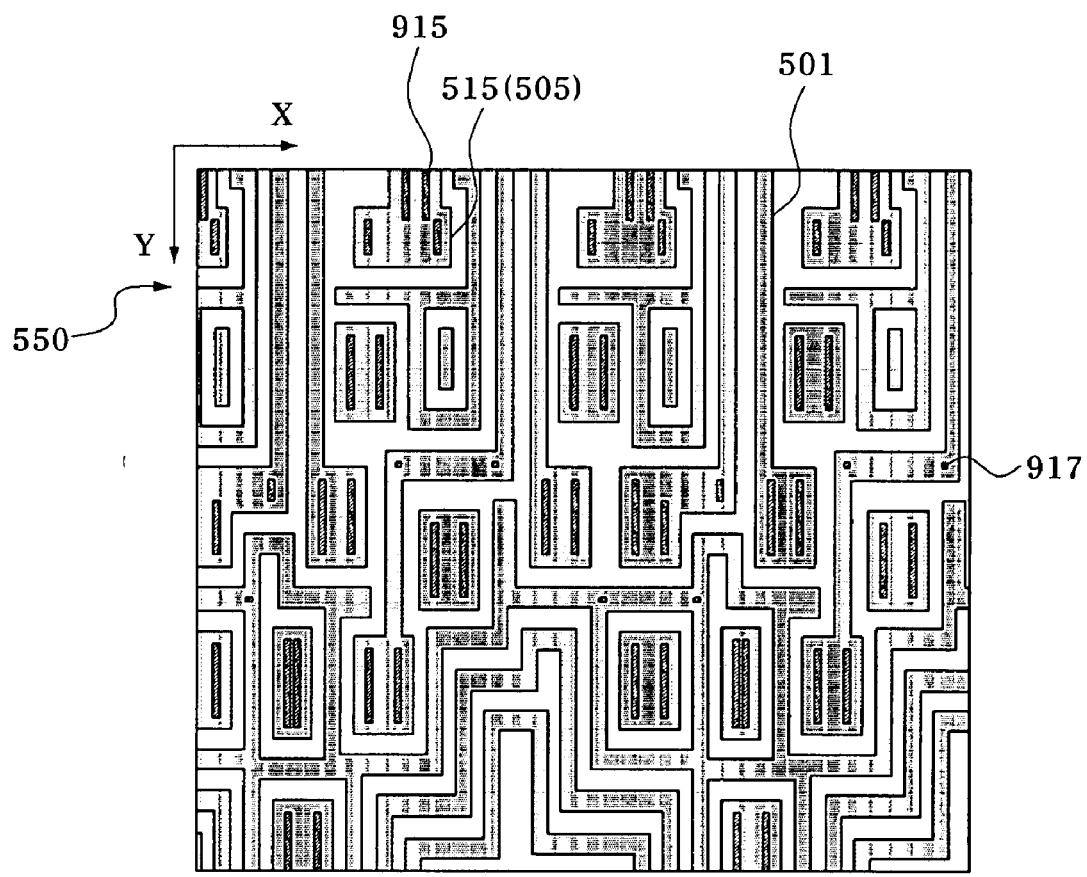

Referring to FIG. 10, assist patterns 915 are generated at step 406 at FIG. 4 by deducting the assist pattern layout 900 in FIG. 9 from the original layout 500 in FIG. 5. The assist patterns 915 are generated as a space positioned within the pad patterns 505 in FIG. 5 of the original layout 500. Select pad patterns 515, (i.e., those in which the assist patterns 915 are generated), are formed such that a scattering bar is substantially included inside.

Meanwhile, a process of deducting the assist pattern layout 900 from the original layout 500 can be performed through the data processing technique using a Boolean operation. For example, data on the layout 550 in which the assist patterns 915 are generated can be obtained by performing the Boolean operation with a condition of the original layout 500 but not the assist pattern layout 900.

Figure 11:
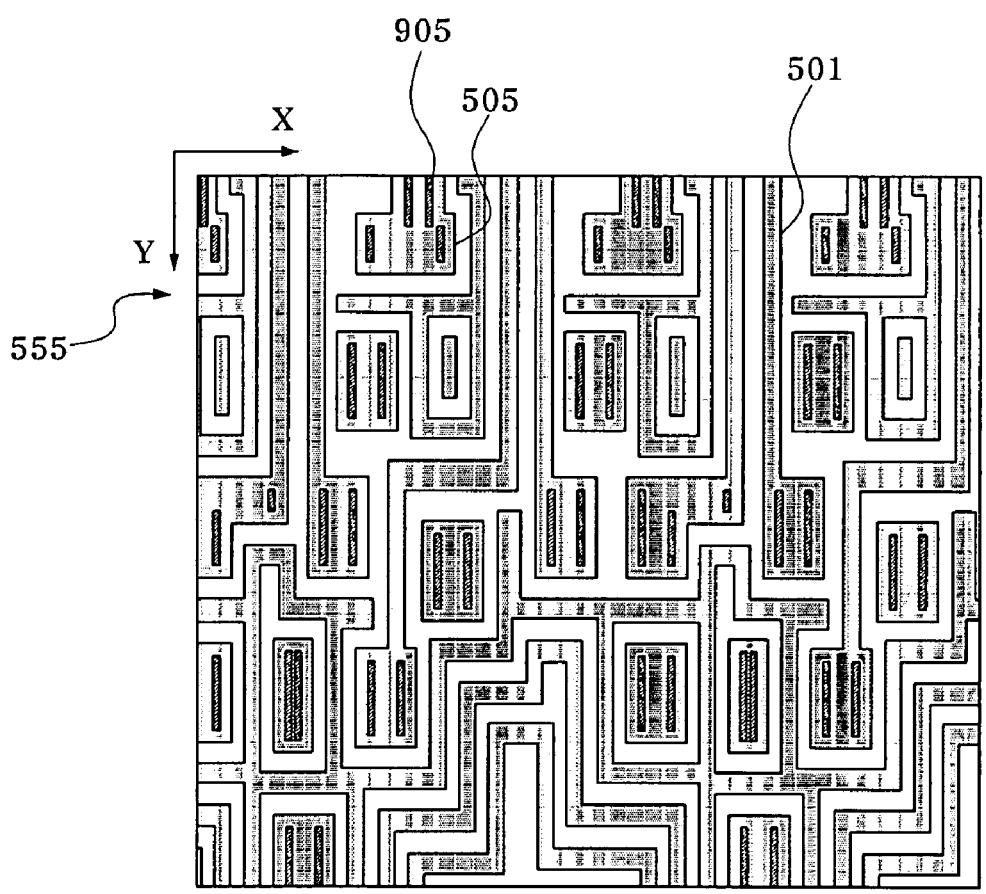

In a process of generating the assist patterns 915, an error pattern 917, formed as a small space so that it cannot operate substantially as an assist pattern, can be generated. By performing an error removing process to remove such an error pattern 917, a circuit layout 555 including the assist patterns 915 in which the error pattern 917 is removed as shown in FIG. 11 can be obtained. The error pattern 915 can be removed from the layout (reference numeral 550 in FIG. 10) by identifying/selecting a dimension below which certain patterns illustrated in FIG. 10 can be classified as the error patterns 917 and removed, as illustrated in FIG. 11.

Figure 12:
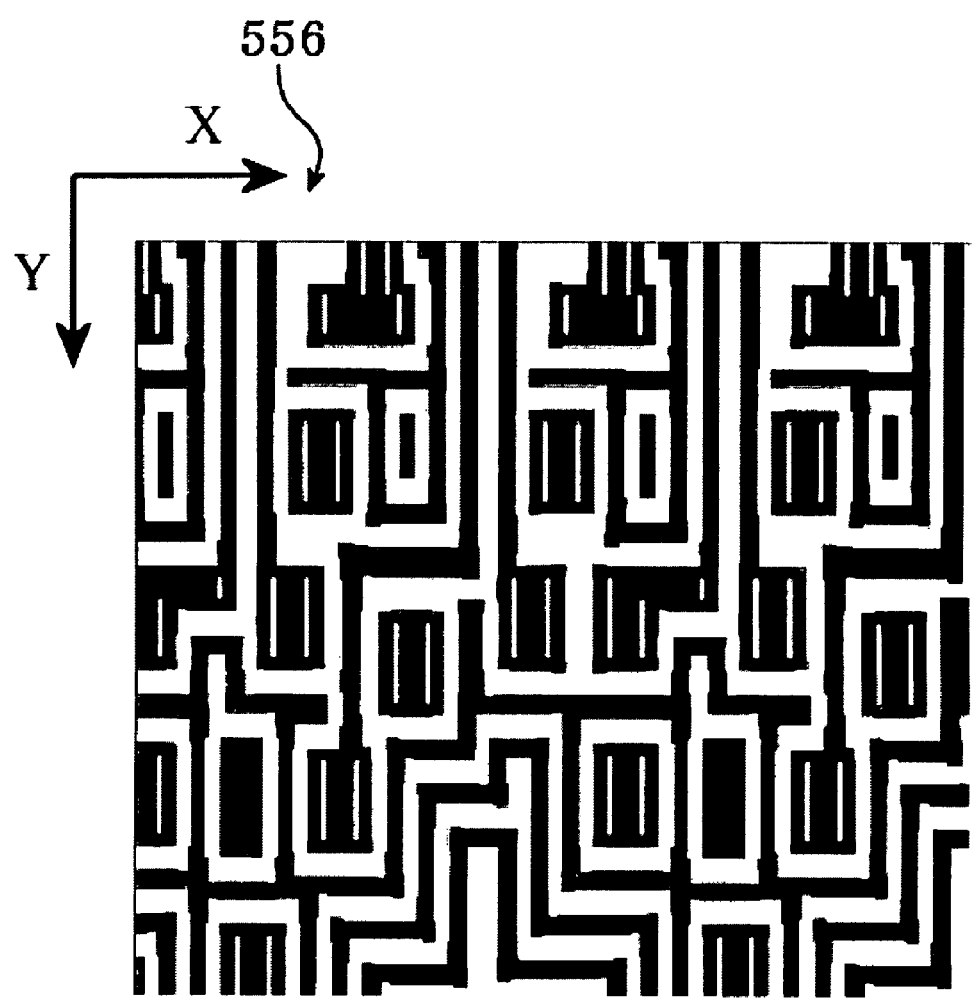

Referring to FIG. 12, an optical proximity correction (OPC) is performed for the layout 555 in FIG. 11 in which the assist patterns 915 in FIG. 11, are generated so that a layout 556, which undergoes the optical proximity correction, is obtained at step 407 of FIG. 4. Considering the optical proximity correction effect generated in an actual exposure process, the optical proximity correction is performed in order to induce a more accurate pattern shape to be projected on a semiconductor substrate. After this, the layout 556 is projected on the semiconductor substrate by projecting the optical proximity corrected layout 556, as a mask pattern, on a transparent quartz mask substrate, forming a photomask and then performing an exposure process using the photomask at step 408 of FIG. 4. Accordingly, a photoresist pattern that suppresses scum formation is formed on the semiconductor substrate. At this time, the photomask can be formed in a half-tone mask structure, a binary mask structure or a phase shift mask structure.

FIGS. 13 to 17 are diagrams illustrating a scum suppressing effect of the lithography method according to an embodiment of the invention.

Figure 13:
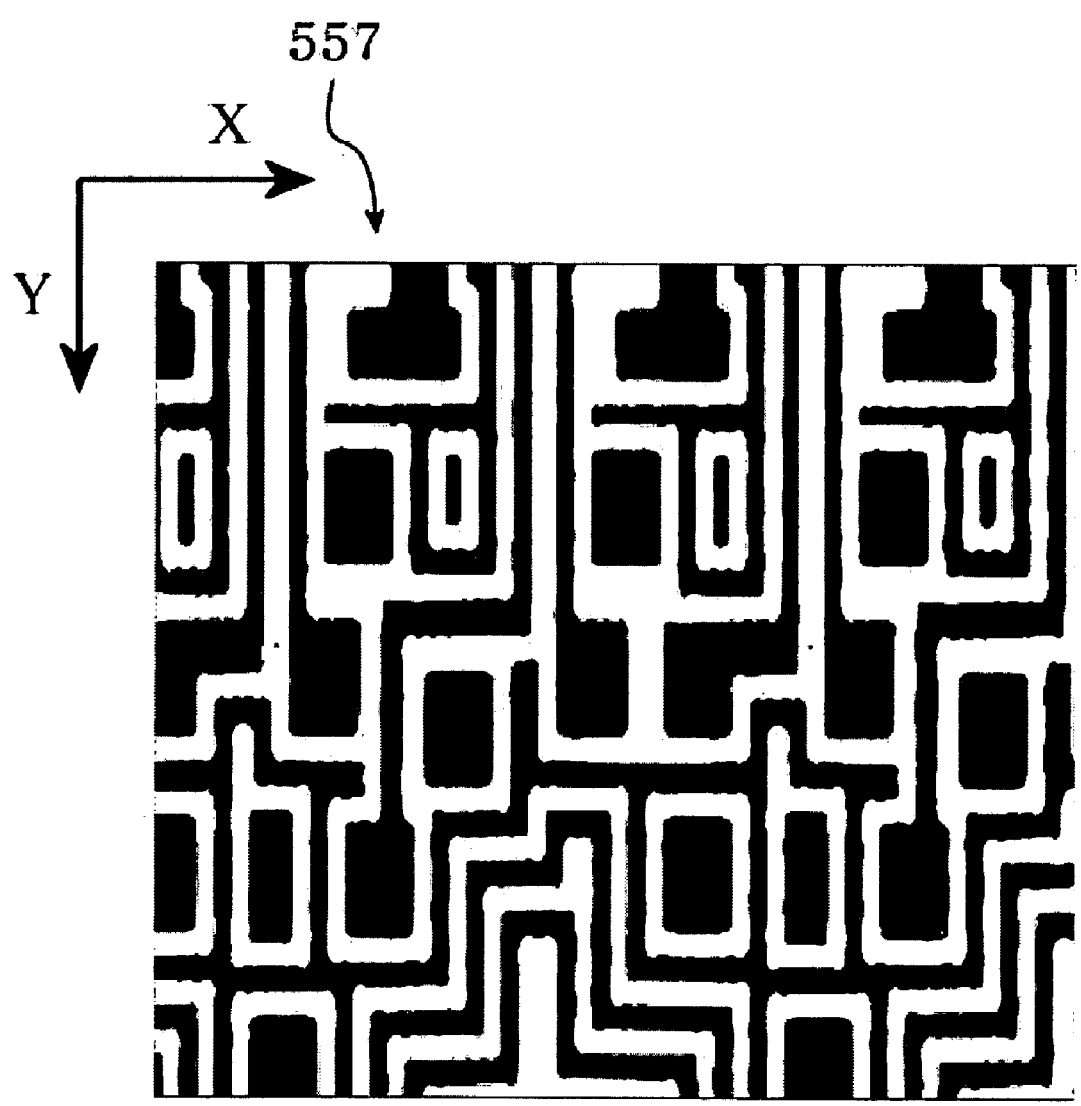
FIGS. 13 to 17 show a scum suppressing effect of a lithography method according to an embodiment of the invention.

Referring to FIG. 13, a simulation image 557 in FIG. 13 for the optical proximity corrected layout 556 suggested in FIG. 12 can be obtained. The simulation image for the optical proximity corrected layout 556 is obtained considering a case that the dipole illumination is adopted in the exposure process as suggested in FIG. 1. The resulting simulation image 557 in FIG. 13 indicates that the scum is effectively suppressed by the introduction of the assist patterns 915 in FIG. 11.

Figure 14:
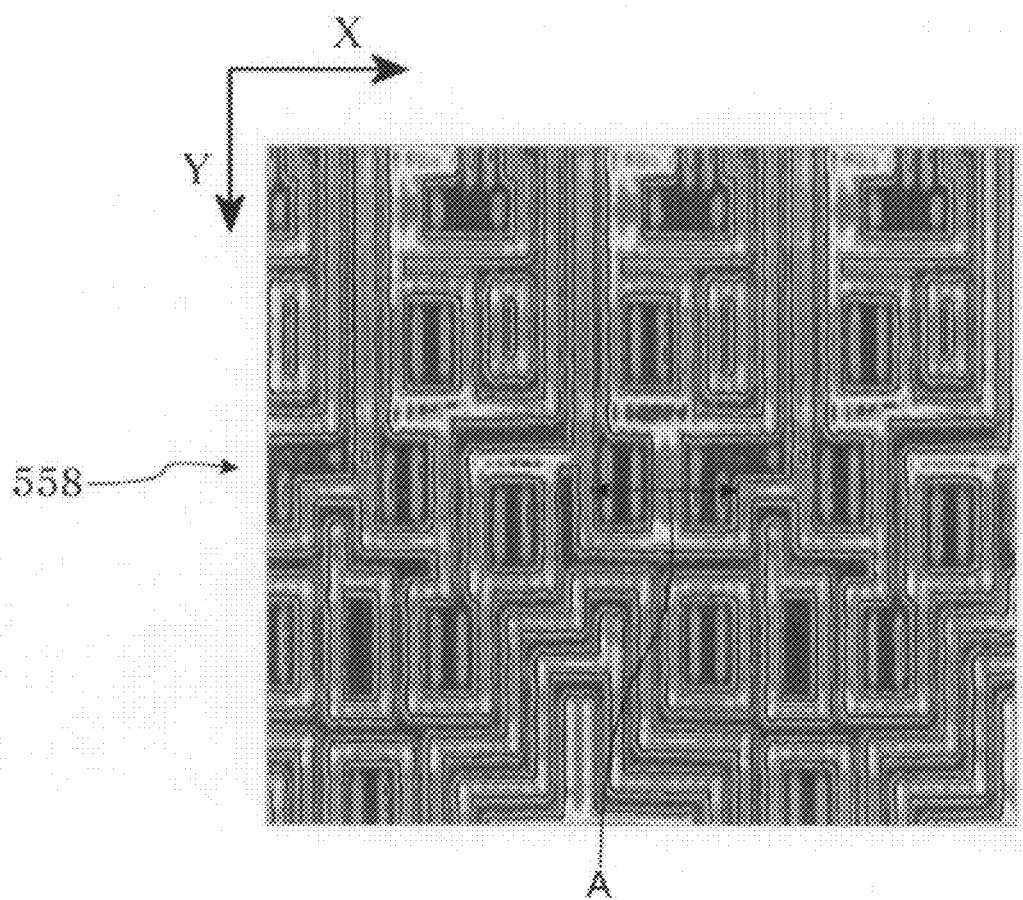
Figure 15:
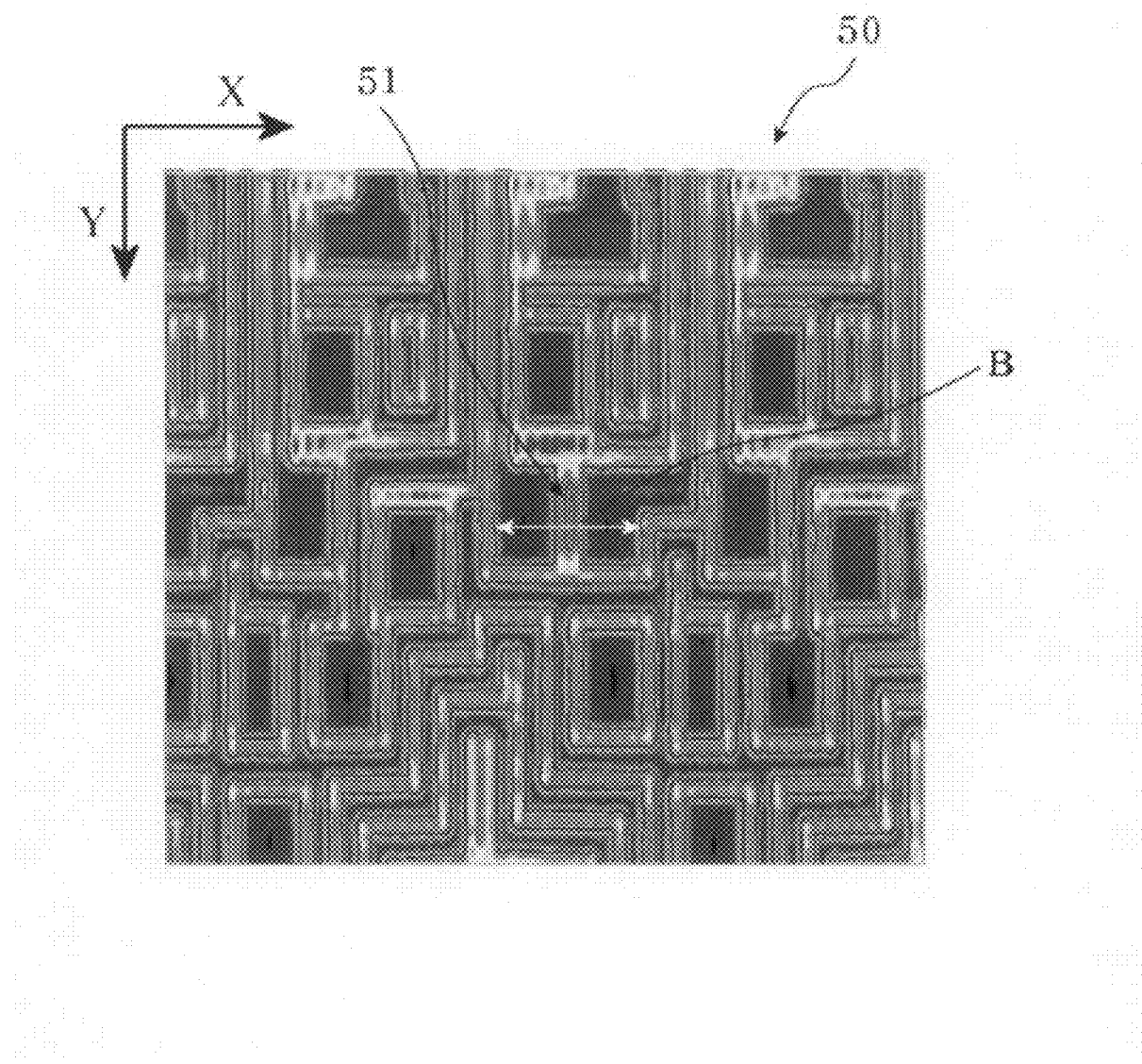

An overhead image 558 in FIG. 14 can be obtained by the simulation for the optical proximity corrected layout 556 shown in FIG. 12. When the assist patterns 915 in FIG. 11 are introduced, scum is not observed across a length A where scum would otherwise be expected. Referring to FIG. 15, an overhead image 50, obtained by a simulation of the optical proximity corrected layout after a performance of an optical proximity correction without the introduction of the assist patterns for the original layout 500 shown in FIG. 5, scum 51 is observed point across an equivalent length B.

Figure 16:
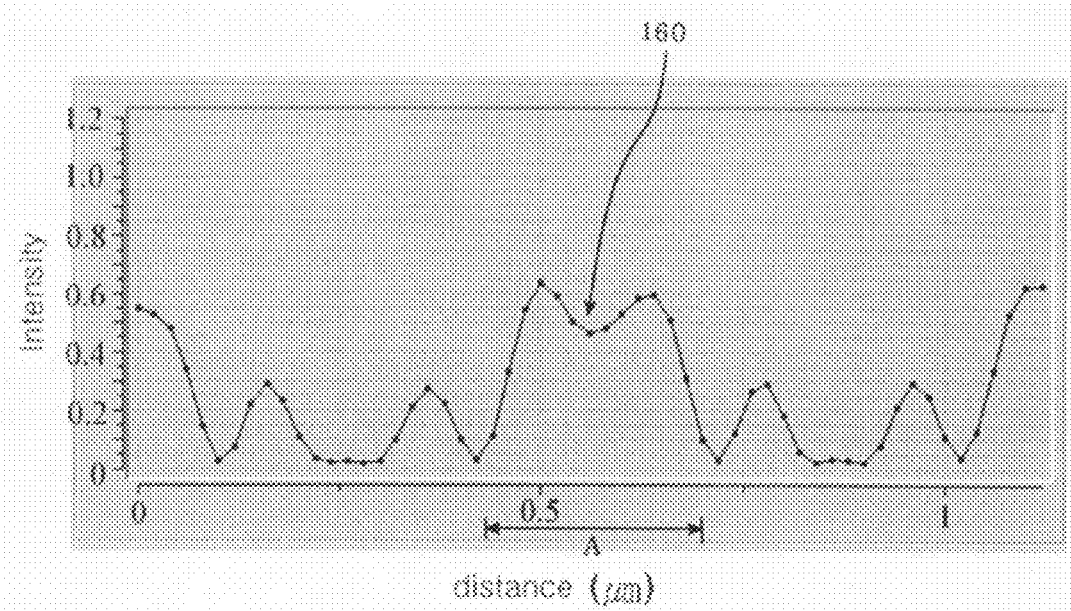
Figure 17:
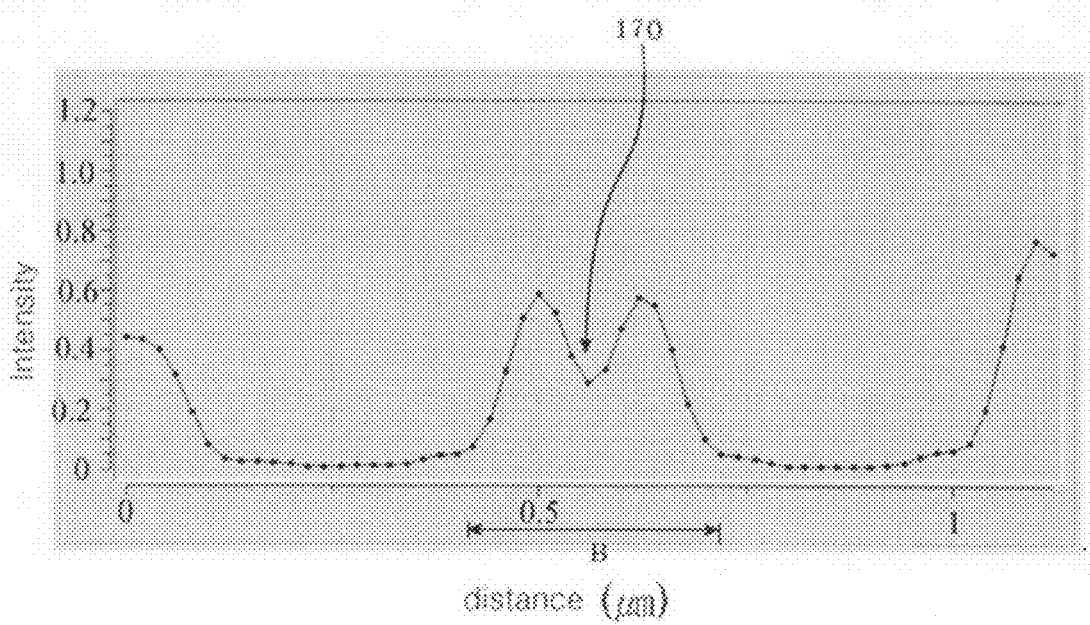

The graph of FIG. 16 illustrates the strength of an exposure light which is measured across the observation length A of FIG. 14, and the graph of FIG. 17 illustrates the strength of an exposure light which is measured across the observation length B of FIG. 15. Comparing FIGS. 16 and 17, a result which is the same as the result of the overhead images 558 and 50 in FIGS. 14 and 15 is observed. In FIG. 17, a point 170, where low intensity exposure light causing the scum 51 of FIG. 15 is observed. However, in FIG. 16, a point 160 is observed, where the weakness of the intensity of the exposure light is mitigated, thereby preventing the formation of scum. The intensity at the point 160 where intensity of the exposure light is weak is measured as intensity to a degree which a photoresist is actually exposed, for example, intensity higher than a reference line of exposure intensity, "0.5". Thus, it is understood that the scum 51 formed in FIG. 15 is sufficiently prevented in FIG. 14.

Figure 18:
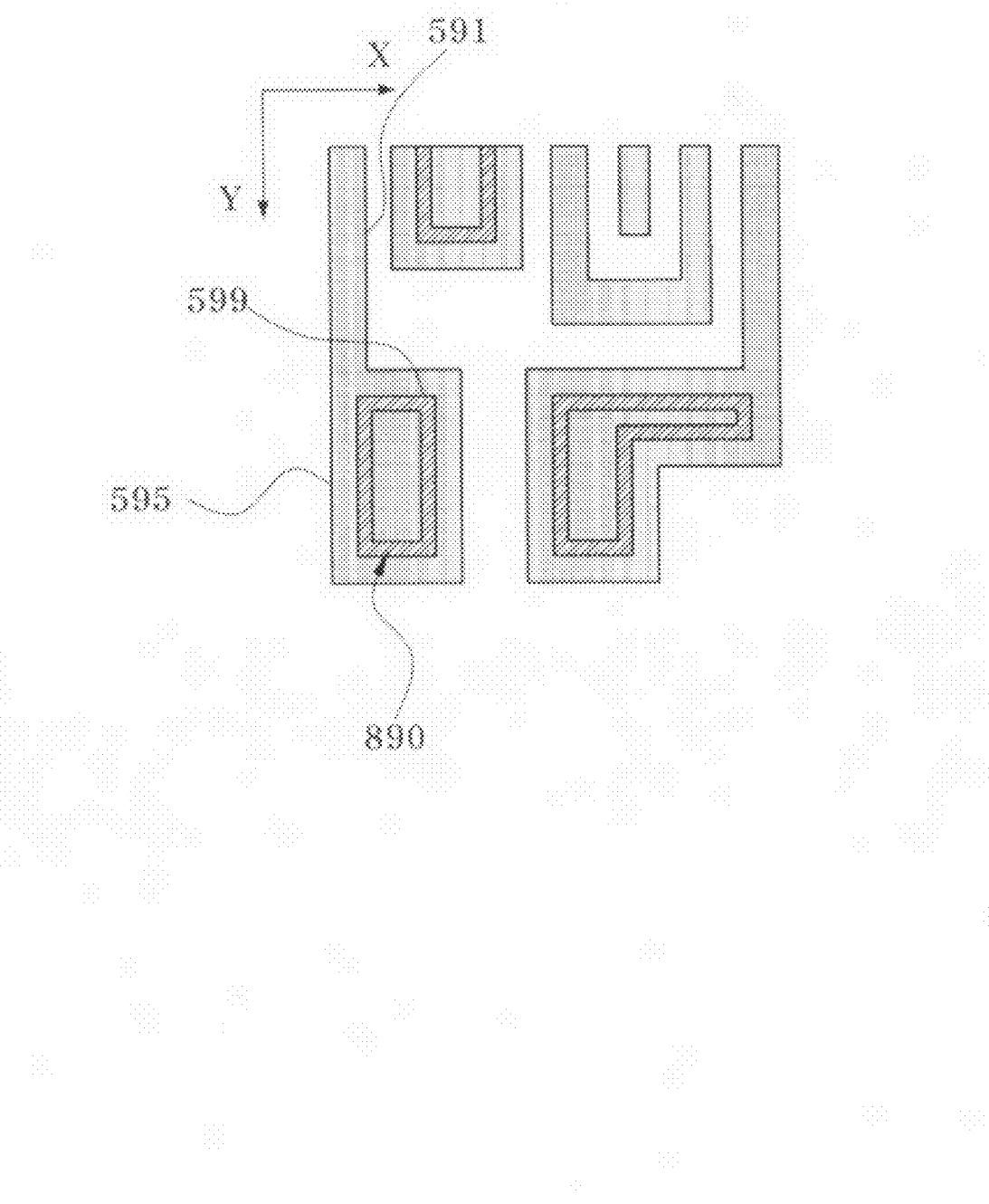
FIG. 18 is a schematic layout illustrating an example of modification of assist patterns according to an embodiment of the invention.

FIG. 18 illustrates an example of a modified assist pattern according to an embodiment of the invention. Referring to FIG. 18, an assist pattern 599 having a form of a ring (e.g., a rectangular ring) can be generated within a pad pattern 595 connected to a line pattern 591 by obtaining a third reduction layout 890 which is reduced by the second reduction width in both the x-direction and the y-direction for the layout 600 of FIG. 6 of the derived pad pattern, deducting the pattern of the third reduction layout 890 from the first reduction layout 700 in FIG. 7 and deducting it from the original layout 500 in FIG. 5, as illustrated in FIGS. 5 to 8. In such a case, the assist pattern 599 having a form of the ring can be generated by a second reduction in the x-direction and the y-direction. In case of generating the assist pattern 599 having a form of a ring, the embodiment of the invention can be efficiently applied to an exposure process using a symmetric illumination system, such as a conventional illumination system, or a symmetrically modified illumination system, such as a quadrupole illumination system.

According to the invention described above, since the assist patterns which are self-aligned in a circuit original layout are generated, the scum caused by the exposure process is more effectively suppressed. As the assist patterns are self-aligned in an original layout, an occurrence of an ill effect generated in a circuit layout can be suppressed. Also, since the assist patterns are applied based on the original layout, their automatic generation is possible so that a process of generating the assist patterns can be swiftly and easily achieved in design tool equipment.

Further, since a scum defect can be suppressed in an asymmetrical illumination system such as a dipole modified illumination system, exposure process efficiency, stability and the margin can be secured. When the assist pattern is generated in a form of a scattering space, process of verifying a layout after the generation of the assist patterns can be simplified because an additional design rule check can be omitted after generating the assist patterns.

While the invention has been described with respect to the particular embodiments, various changes and modifications may be made without departing from the spirit and scope of the invention as defined in the following claims.

What is claimed is:

1. A lithography method for forming a circuit pattern, comprising the steps of:
   designing an original layout comprising line patterns and pad patterns;
   extracting a pad pattern layout from the original layout;
   obtaining a first reduction layout which is reduced by a first reduction width relative to the pad pattern layout;
   obtaining a second reduction layout which is reduced by a second reduction width larger than the first reduction width relative to the pad pattern layout;
   obtaining an assist pattern layout which is self-aligned to the pad pattern layout by deducting the second reduction layout from the first reduction layout;
   generating assist patterns in the original layout by deducting the assist pattern layout from the original layout; and
   projecting a layout including the assist patterns on a semiconductor substrate by an exposure process,
   wherein at least one of the steps of extracting a pad pattern layout and generating assist patterns in the original layout is carried out using a computer.

2. The lithography method of claim 1, wherein the pad patterns have line widths and spaces relatively larger than the line widths and spaces of the line patterns.

3. The lithography method of claim 1, wherein the first reduction layout is reduced by the first reduction width in equal amounts in both an x-direction and a y-direction.

4. The lithography method of claim 1, wherein the first reduction layout is reduced by the first reduction width in different amounts in an x-direction and a y-direction.

5. The lithography method of claim 1, wherein the second reduction width is larger than the first reduction width in one of an x-direction and a y-direction and is equal to the first reduction width in the other direction, thereby resulting in an assist pattern in the form of a scattering bar.

6. The lithography method of claim 1, wherein the second reduction width is larger than the first reduction width in both an x-direction and a y-direction, thereby resulting in an assist pattern in the form of a scattering ring.

7. The lithography method of claim 1, wherein the step of obtaining the assist pattern layout includes the step of performing a Boolean operation in which pattern information is included in data of the first reduction layout but not in data of the second reduction layout.

8. The lithography method of claim 1, wherein the step of generating the assist pattern in the original layout includes the step of performing a Boolean operation in which pattern information is included in data of the original layout but not in data of the layout of the assist pattern.

9. The lithography method of claim 1, further comprising the step of extracting an error pattern smaller than a selected reference size and removing the error pattern when generating the assist patterns in the original layout.

10. The lithography method of claim 1, further comprising the step of performing an optical proximity correction on the original layout in which the assist pattern is generated.

11. The lithography method of claim 1, comprising performing the exposure process with an asymmetrically modified illumination system.

12. The lithography method of claim 1, comprising performing the exposure process with a dipole modified illumination system.

13. A lithography method for forming a circuit pattern, comprising the steps of:
designing an original layout comprising line patterns and pad patterns;
extracting a pad pattern layout from the original layout;
obtaining a first reduction layout which is reduced by a first reduction width relative to the pad pattern layout;
obtaining a second reduction layout which is reduced by a second reduction width relative to the first reduction layout;
obtaining an assist patterns layout which is self-aligned to the pad pattern layout by deducting the second reduction layout from the first reduction layout;
generating assist patterns in the original layout by deducting the assist pattern layout from the original layout; and
projecting a layout having the assist patterns on a semiconductor substrate by an exposure process,
wherein at least one of the steps of extracting a pad pattern layout and generating assist patterns in the original layout is carried out using a computer.

14. A lithography method for forming a circuit pattern, comprising the steps of:
designing an original layout comprising line patterns and pad patterns;
setting up an illumination system asymmetrically modified in a given direction for an exposure process by which a layout can be projected on a semiconductor substrate;
extracting pad pattern layout from the original layout;
obtaining a first reduction layout which is reduced by a first reduction width relative to the pad pattern layout;
obtaining a second reduction layout which is reduced by a second reduction width relative to the pad pattern layout, the second reduction width being larger than the first reduction width in one direction depending on the direction of the asymmetrically modified illumination system relative to the pad pattern layout;
obtaining an assist pattern layout in a form of a scattering bar, which is self-aligned to the pad pattern layout by deducting the second reduction layout from the first reduction layout;
generating assist patterns in the original layout by deducting the assist pattern layout from the original layout; and
projecting a layout having the assist patterns on a semiconductor substrate by an exposure process,
wherein at least one of the steps of extracting a pad pattern layout and generating assist patterns in the original layout is carried out using a computer.

15. The lithography method claim 14, wherein the pad patterns have line widths and spaces relatively larger than the line widths and spaces of the line patterns.

16. The lithography method of claim 14, wherein the asymmetrically modified illumination system includes a dipole illumination system in an x-direction having an aperture structure in which openings are positioned in the x-direction of an x-y coordinate system and the second reduction width is set in the x-direction so that the assist pattern is extended in the form of a bar in the y-direction.

17. The lithography method of claim 14, wherein the first reduction width is the same in both an x-direction and a y-direction.

18. The lithography method of claim 17, wherein the first reduction width is different in both an x-direction and a y-direction.

19. The lithography method of claim 14, wherein the step of obtaining of the layout of the assist pattern includes the step of performing a Boolean operation in which pattern information is included in data of the first reduction layout but not in data of the second reduction layout.

20. The lithography method of claim 14, wherein the step of generating of the assist pattern in the original layout includes the step of performing a Boolean operation in which pattern information is included in data of the original layout but not in data of the layout of the assist pattern.

21. The lithography method of claim 14, further comprising the step of performing an optical proximity correction on the layout in which the assist pattern is generated.

22. A lithography method for forming a circuit pattern, comprising the steps of:
designing an original layout comprising line patterns and pad patterns;
setting up an illumination system asymmetrically modified in a given direction to be used in an exposure process by which a layout can be projected on a semiconductor substrate;
extracting a pad pattern layout from the original layout;
obtaining a first reduction layout which is reduced by a first reduction width relative to the pad pattern layout;
obtaining a second reduction layout which is reduced by a second reduction width in one direction depending on the direction of the asymmetrically modified illumination system relative to the first reduction layout;
obtaining an assist pattern layout in a form of a scattering bar, which is self-aligned to the pad pattern layout by deducting the second reduction layout from the first reduction layout;
generating assist patterns in the original layout by deducting the assist pattern layout from the original layout; and
projecting the layout having the assist patterns on a semiconductor substrate by an exposure process,
wherein at least one of the steps of extracting a pad pattern layout and generating assist patterns in the original layout is carried out using a computer.

* * * * *